United States Patent [19]

Matsuura et al.

[11] 3,889,210

[45] June 10, 1975

[54] LOCAL OSCILLATION CIRCUIT FOR REDUCING OSCILLATION VOLTAGE VARIATIONS BETWEEN HIGH AND LOW FREQUENCY BANDS

[75] Inventors: Shigeo Matsuura, Ayasemachi; Takeshi Saitoh; Hiroshi Miyamoto, both of Yokohama, all of Japan

[73] Assignee: Hitachi, Ltd., Japan

[22] Filed: Sept. 26, 1973

[21] Appl. No.: 400,923

[30] Foreign Application Priority Data

Sept. 29, 1972 Japan .............................. 47-97073

[52] U.S. Cl. .......... 331/109; 331/117 R; 331/177 V; 331/179; 331/183; 334/15

[51] Int. Cl. .......................... H03b 3/02; H03b 5/12

[58] Field of Search ............ 331/109, 117 R, 177 V, 331/179, 183; 325/453, 454, 457, 458; 334/15, 56, 58

[56] References Cited

UNITED STATES PATENTS 3,611,154 10/1971 Kupter .............................. 334/15 X 3,813,615 5/1974 Okazaki ...................... 331/117 R X

*Primary Examiner*—Siegfried H. Grimm

*Attorney, Agent, or Firm*—Craig & Antonelli

[57] ABSTRACT

The proposed local oscillation circuit comprises a resonance circuit including a variable capacitance diode to change the resonance frequency and tuning coils for low and high frequency bands, an oscillating transistor connected with the resonance circuit, change-over means for switching the tuning coils between the low and the high frequency bands, biasing means for providing a bias voltage for the oscillating transistor, and means for changing over a collector current of the transistor by changing the bias voltage applied by the biasing means to the transistor, in response to the operation of the tuning coil change-over means. The local oscillation circuit is well adapted to be used in a tuner of a receiver which receives a wide range of frequencies, e.g. a VHF television tuner.

3 Claims, 5 Drawing Figures

LOCAL OSCILLATION CIRCUIT FOR REDUCING OSCILLATION VOLTAGE VARIATIONS BETWEEN HIGH AND LOW FREQUENCY BANDS

BACKGROUND OF THE INVENTION

1. Field of the Invention

The present invention relates to a local oscillation circuit used in a television receiver or in a radio receiver used in communications system, and more particularly to a local oscillation circuit comprising a variable capacitance diode and a transistor, in which the capacitance of the diode used as a tuning element is varied by changing the reverse bias voltage applied to the diode so that the oscillating frequency of the transistor may be varied.

2. Description of the Prior Art

The conventional VHF tuner used in a television receiver has two tuning coils for high and low bands which coils are changed over to cover all the VHF channels since the range of the variable capacitance of the variable capacitance diode used in the tuner is not sufficiently wide. In such a case, during reception of a signal of the high band, that is, at high frequencies, the resistance of a switching diode to change over the tuning coils is not zero in its conduction state so that unloaded Q-factor of the tuning circuit becomes low. Moreover, the efficiency of oscillation of the transistor decreases with the increase in frequency so that the output of the local oscillation circuit decreases at such high frequencies. Therefore, there is left a drawback in that, even if a power input to a mixer circuit is sufficient during reception of a signal of the low band, the power input is insufficient during reception of a signal of the high band and therefore the conversion gain of the mixer circuit on reception of a signal of the high band will decrease. Further, if the collector current of the transistor is so determined that the local oscillation output on reception of a signal of the high band may be large so as to prevent the decrease in the high band conversion gain, then the local oscillation output on reception of a signal of the low band also increases up to several times the local oscillation output on reception of a signal of the high band. The increase in the amplitude of an a.c. signal applied to the variable capacitance diode is accompanied by the increase in the degree of the influence due to the non-lineality of the voltage-to-capacitance characteristic of the diode so that the frequency stability against the fluctuation of the source voltage and the temperatures is degraded on reception of a signal of the low band. In order to eliminate this drawback, it is only necessary to increase the minimum reverse voltage applied to the variable capacitance diode. In such a case, however, the range of the variable capacitance of the diode is rendered narrower and therefore the minimum reverse voltage is limited. This is because the conventional local oscillation circuit can only be designed at the sacrifice, to a certain extent, of either frequency stability or the conversion gain. These drawbacks mentioned above cause problems especially in VHF television broadcasting in the United States where the frequency range in the low band is wide, or in the case where field effect transistors are used in the mixer circuit so that a large injection current is necessary.

SUMMARY OF THE INVENTION

One object of the present invention is to provide a local oscillation circuit having a good frequency stability over the whole range of the oscillation frequency.

Another object of the present invention is to provide a local oscillation circuit capable of producing a uniform and sufficient oscillation output over all ranges of the oscillation frequency.

Yet another object of the present invention is to provide a VHF tuner having large gains from the low band up to the high band, which gains are of uniform level over all channels.

Accordingly, the local oscillation circuit according to the present invention uses the technical feature that the output power of the local oscillation circuit varies depending upon the collector current of the oscillating transistor but almost independent of the collector-base bias voltage.

Therefore, the local oscillation circuit according to the present invention comprises a resonance circuit including a variable capacitance diode to change the resonance frequency and tuning coils for low and high bands; an oscillating transistor connected with the resonance circuit; change-over means for switching the tuning coils between the low and the high bands; biasing means for providing a bias voltage for the oscillating transistor; and means for changing over a collector current of the transistor by changing the bias voltage applied by the biasing means to the transistor, in response to the operation of the tuning coil change-over means.

Accordingly, the proposed local oscillation circuit can deliver almost the same oscillation power output at low and high frequencies of the respective low and high bands. Moreover, a VHF television tuner using the present local oscillation circuit can provide an excellent frequency stability and large gains over all channels.

DESCRIPTION OF THE PREFERRED EMBODIMENTS

Figure 1:
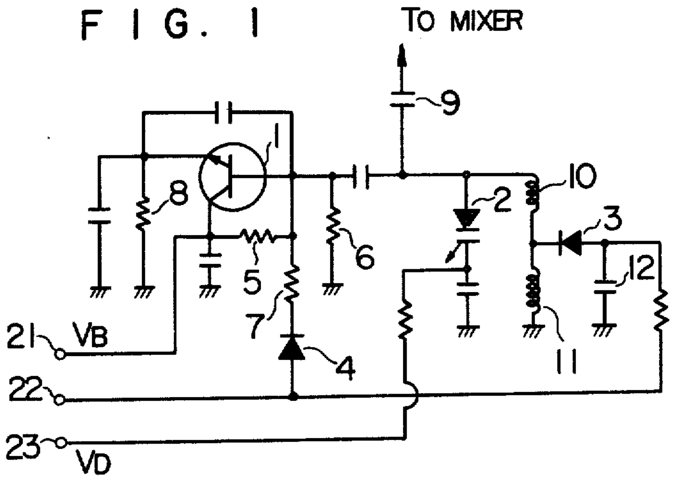
FIG. 1 is an example of a local oscillation circuit embodying the present invention.

FIG. 1 shows an example of a local oscillation circuit embodying the present invention. In FIG. 1 are shown an oscillating transistor 1; a variable capacitance diode 2; a switching diode 3 to change over tuning coils; a switching diode 4 to change over the bias voltages applied to the transistor 1; biasing resistors 5, 6 and 7 to determine the collector current of the transistor 1; a coupling capacitor 9 connected with a mixer circuit; tuning coils 10 and 11 respectively for high and low bands; a capacitor 12 for by-passing high frequency signals; a terminal 21 to which a biasing voltage for the transistor 1 is applied; a terminal 22 to which a voltage for operating the switching diodes 3 and 4 is applied; and a terminal 23 through which a reverse biasing voltage is applied to the variable capacitance diode 2.

When voltages of −7V and +12V are applied respectively to the terminals 22 and 21, the diode 3 is reversely biased and therefore cut off. Accordingly, the tuning coils 10 and 11 are in series arrangement and therefore the tuning inductance is large to be suitable for generating a local oscillation frequency adapted to receive a signal of the low band. In this case, the diode 4 is also reversely biased and therefore the bias voltage for the transistor 1 is determined by the resistors 5, 6 and 8 so that the oscillation occurs at the frequency corresponding to the tuned frequency determined by the capacitance of the variable capacitance diode 2 and the inductance of the tuning coils 10 and 11. If a voltage of 12V is applied also to the terminal 22, the diode 3 is forward biased to be conductive. Accordingly, the coil 11 is considered to be short-circuited through the capacitor 12 at high frequencies so that the tuning inductance is reduced to be tuned to a local oscillation frequency adapted to receive a signal of the high band. Also, in this case, the diode 4 is forward biased and the resistor 7 is connected equivalently in parallel to the resistor 5. Accordingly, the base-emitter bias voltage of the transistor 1 is high while the base-collector bias voltage of the transistor 1 is low, so that the collector current increases to cause the local oscillation circuit oscillating at the high band frequency to deliver an increased output.

Figure 2:
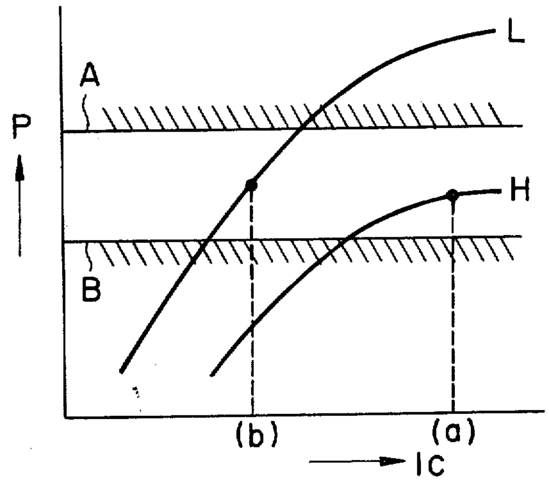
FIG. 2 shows characteristic curves illustrating the relation of the collector current of the oscillating transistor to its oscillation output, useful to explain the operational principle of the local oscillation circuit according to the present invention.

FIG. 2 shows the relation between the collector current of the transistor in the oscillation circuit and the oscillation power output. In FIG. 2, the abscissa and the ordinate give the collector current $I_c$ and the oscillating power output P respectively. Curve L represents a characteristic at a lower oscillating frequency and curve H a characteristic at a higher oscillating frequency. A straight line A defines the limit which the oscillation output power P cannot exceed without the degradation of the frequency stability while a straight line B is the limit below which the power P cannot fall without the decrease in the conversion gain. As seen from the curves in FIG. 2, the oscillation output power P increases as the collector current increases, but decreases as the frequency increases.

In this way, as described in conjunction with FIG. 1, during reception of a signal of the low band, that is, when the diode 4 is reverse-biased, the collector current of the transistor 1 can be chosen to be such a small value as shown at point (b) in FIG. 2 while, during reception of a signal of the high band, that is, when the resistors 5 and 7 are connected in parallel to each other, the collector current can be increased up to such a value as shown at point (a) in FIG. 2. Accordingly, at both the high band and low band can be obtained an oscillation output power lying between the limit A above which the frequency stability degrades and the limit B below which the conversion gain decreases.

In a tuner using a variable capacitance diode as shown in FIG. 1, the voltage to operate the switching diode 3 to change over the tuning coils is thus prepared, and it is easy to change over the collector current of the oscillating transistor between the high and the low bands.

The collector current of the transistor 1 can be calculated in a manner as follows: Since the diode 4 is cut off during reception of a signal of the low band, the bias voltage of the transistor 1 is determined by the resistors 5, 6 and 8, as described above. In this case, the collector current $I_{CL}$ is given by the following equation (1):

$$I_{CL} = \left\{ V_B \times R_6/R_5 + R_6 - V_{BE} \right\} \times 1/R_8 \qquad (1)$$

where $R_5$, $R_6$ and $R_8$ are the resistances of the resistors 5, 6 and 8 respectively; $V_B$ is the voltage applied to the terminal 21; and $V_{BE}$ is the fundamental base-emitter voltage of the transistor 1.

When the same voltage is applied to the terminals 21 and 22 during reception of a signal of the high band, the resistors 5 and 7 are connected in parallel with each other. In such a case, the collector current $I_{CH}$ is given by the following equation (2):

$$I_{CH} = \left\{ V_B \times \frac{R_6}{\frac{R_5 R_7}{R_5 + R_7} + R_6} - V_{BE} \right\} \times \frac{1}{R_8} \cdots \qquad (2)$$

where $R_7$ is the resistance of the resistor 7. As seen from the equations (1) and (2), it is easy to choose the collector currents $I_{CH}$ and $I_{CL}$ to be respectively the values indicated at the points (a) and (b) in FIG. 2, by appropriately choosing the resistances of the resistors 5 to 8.

Figure 3:
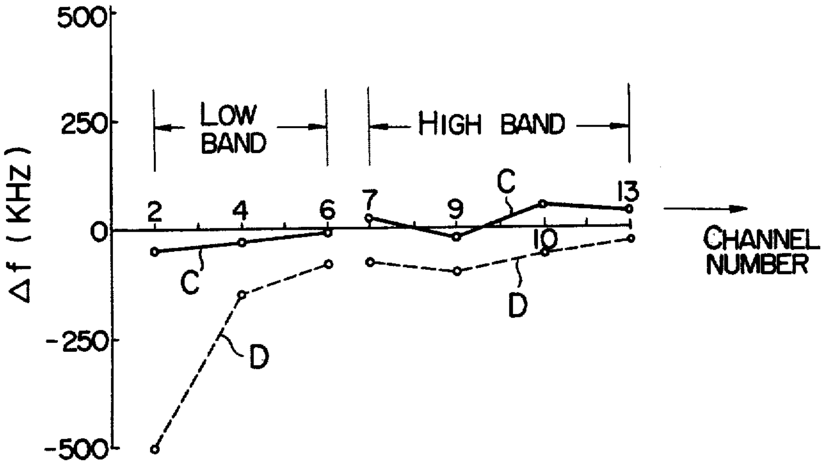
FIG. 3 shows characteristic curves illustrating the frequency stability against temperatures of a VHF television tuner of the USA channel type using a local oscillation circuit according to the present invention.

FIG. 3 shows the frequency stability against temperatures of a VHF tuner for the channels in the United States, using the local oscillation circuit according to the present invention. In FIG. 3 is shown a deviation $\Delta f$ in the local oscillation frequency for each channel, caused when the ambient temperature rises from 20°C to 40°C, i.e. with an increase of 20°C. The abscissa and the ordinate represent the channel number and the frequency deviation $\Delta f$, respectively. Curve C corresponds to the oscillation circuit according to the present invention and curve D to a conventional oscillator.

Figure 4:
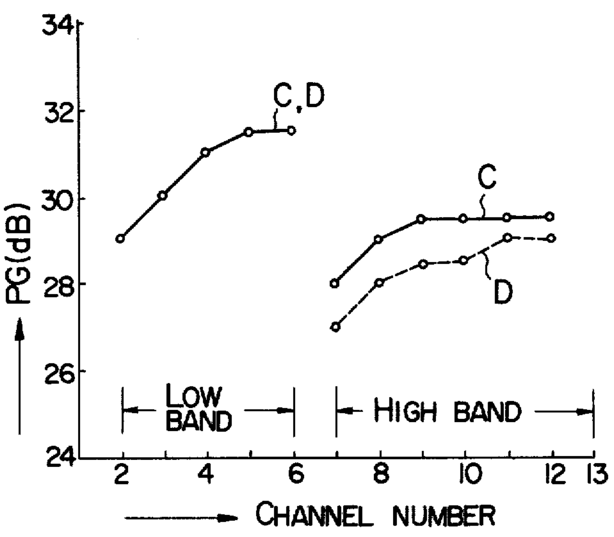
FIG. 4 shows characteristic curves illustrating the power gain of the same tuner.

FIG. 4 shows a power gain for each channel of the VHF tuner mentioned above, in which the abscissa and the ordinate respectively represent the channel number and the power gain. Curve C corresponds to the power gain G of the tuner using the oscillation circuit according to the present invention and curve D to that of the conventional tuner. As seen from FIGS. 3 and 4, the frequency stability and the power gain of the tuner according to the present invention are much better and greater than those of the conventional tuner.

Figure 5:
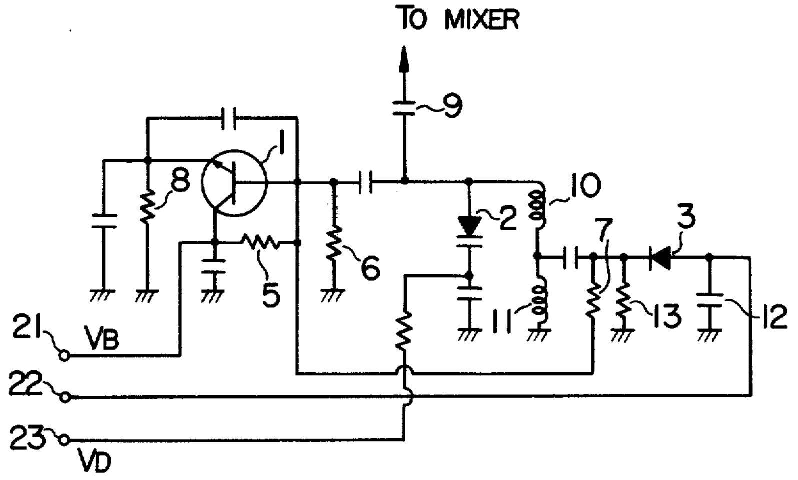
FIG. 5 is another example of the local oscillation circuit embodying the present invention.

FIG. 5 shows another embodiment of the present invention, in which one and the same switching diode 3 serves to change over both tuning coils and bias voltages. When the switching diode 3 is cut off, that is, during reception of a signal of the low band, series connected resistors 7 and 13 are shunted with a resistor 6 to determine the base bias voltage of a transistor 1. During reception of a signal of the high band, the same voltage is applied to terminals 21 and 22. In this case, the resistor 7 is in parallel confuguration with a resistor 5 so that the base bias voltage of the transistor 1 rises to increase the collector current. Concerning the resonance circuit, on the other hand, coils 10 and 11 are in series with each other at the cut-off of the switching diode 3 to form a composite tuning coil having an inductance of the sum of its component inductances while the coil 11 is short-circuited at the conduction of the switching diode 3 so that only the coil 10 serves as a tuning coil.

In the circuit shown in FIG. 5, when the switching diode 3 is cut off, the resistors 7 and 13 are connected in parallel with the coil 11. Therefore, it is necessary to determine the resistances of the bias resistors 5 to 8 and 13 in such a manner that the Q-factor of the resonance circuit on reception of a signal of the low band may be prevented from being lowered too much. It is preferable to select the equivalent total resistance to be connected in parallel with the coil 11 to be more than several kilo-ohms (kΩ).

In the foregoing description, the present invention has been explained as applied solely to a tuner of a television receiver, but it is apparent that the same effect can be attained if the present invention is applied to a tuner used in communication systems. In the disclosed embodiments, the oscillating transistor is used in the collector grounded configuration but it goes without saying that the transistor may be used in the emitter or base grounded configuration.

We claim:

1. A local oscillation circuit used in a tuner of a receiver whose reception frequency is variable, comprising

- a resonance circuit including a variable capacitance diode to change the resonance frequency of the circuit and tuning coils for low and high frequency bands;
- an oscillating transistor connected with said resonance circuit;
- a first switching diode;
- first biasing means for selectively supplying said first switching diode with a bias voltage to render said switching diode on and off alternatively according to said high and low bands of reception frequencies;
- means for changing over said tuning coils of said resonance circuit according to the conduction and cut-off of said first switching diode;
- second biasing means for supplying said transistor with a bias voltage so as to start the oscillation operation of said transistor;
- a second switching diode provided in said second biasing means and adapted to be rendered on and off alternatively according to the value of said bias voltage supplied from said first biasing means; and
- means for changing the collector current of said transistor according to the conduction and cut-off of said second switching diode so as to increase the collector current during reception of a signal of said high frequency band.

2. A local oscillation circuit used in a tuner of a receiver whose reception frequency is variable, comprising

- a resonance circuit including a variable capacitance diode to change the resonance frequency of the circuit and series-connected tuning coils for low and high frequency bands;
- an oscillating transistor connected with said resonance circuit;
- a first switching diode for short-circuiting in view of an alternating current one of said tuning coils when said first switching diode is rendered conductive;

- first biasing means for selectively supplying said first switching diode with a bias voltage so as to render said first switching diode on and off alternatively according to said high and low frequency bands;
- second biasing means for supplying said transistor with a bias voltage so as to start the oscillation operation of said transistor;
- a second switching diode provided in said second biasing means and adapted to be rendered on and off according to the value of said bias voltage supplied from said first biasing means; and
- means for changing the collector current of said transistor according to the conduction and the cut-off of said second switching diode so as to increase the collector current during reception of a signal of said high frequency band.

3. A local oscillation circuit used in a tuner of a receiver whose reception frequency is variable, comprising:

- a parallel resonance circuit including a variable capacitance diode, a fixed capacitor connected in series with said variable capacitance diode, series-connected tuning coils for low and high frequency bands, said series-connected coils being connected in parallel relation with the series circuit of said variable capacitance diode and said fixed capacitor, one end of said parallel resonance circuit being grounded;
- means for supplying a variable reverse bias to said variable capacitance diode for changing the resonance frequency of said parallel resonance circuit;
- a series connection of a first switching diode and a capacitor, said series connection being connected in parallel with one of said series-connected coils;
- a switching power source for selectively rendering said first switching diode conductive and non-conductive in accordance with the low and high frequency bands of the reception frequency;
- means for applying a voltage from said switching power source to said first switching diode;
- an oscillation transistor connected to the other end of said parallel resonance circuit through a capacitor;
- a power supply for supplying a bias voltage to said transistor;
- series-connected resistors connected between said power supply and the ground for dividing the voltage of said power supply;
- means for applying a divided voltage obtained at the intermediate junction point of said series-connected resistors to the base electrode of said transistor;
- means for applying a voltage of said power supply between the collector and emitter electrodes of said transistor; and
- a second switching diode connected between the base electrode of said transistor and said switching power source through a resistor, said second switching diode being selectively rendered conductive and non-conductive at the same time as said first switching diode being rendered conductive and non-conductive, respectively.

* * * * *